(12) United States Patent
Zhang et al.

(10) Patent No.: US 11,810,966 B2
(45) Date of Patent: Nov. 7, 2023

(54) SEMICONDUCTOR STRUCTURE AND METHOD FOR FABRICATING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Haiyang Zhang, Shanghai (CN); Panpan Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/684,240

(22) Filed: Mar. 1, 2022

(65) Prior Publication Data

US 2022/0190138 A1 Jun. 16, 2022

Related U.S. Application Data

(62) Division of application No. 17/034,335, filed on Sep. 28, 2020, now Pat. No. 11,302,803.

(30) Foreign Application Priority Data

Nov. 5, 2019 (CN) .......................... 201911071524.9

(51) Int. Cl.
| | | |
|---|---|---|
| *H01L 29/76* | (2006.01) | |
| *H01L 29/94* | (2006.01) | |
| *H01L 29/66* | (2006.01) | |
| *H01L 29/06* | (2006.01) | |
| *H01L 27/088* | (2006.01) | |
| *H01L 29/78* | (2006.01) | |
| *H01L 29/417* | (2006.01) | |

(52) U.S. Cl.
CPC ...... *H01L 29/6681* (2013.01); *H01L 27/0886* (2013.01); *H01L 29/0649* (2013.01); *H01L 29/41791* (2013.01); *H01L 29/785* (2013.01)

(58) Field of Classification Search
CPC ............. H01L 29/6681; H01L 27/0886; H01L 29/0649; H01L 29/41791; H01L 29/785; H01L 21/743; H01L 21/823431; H01L 29/66795; H01L 23/5286; H01L 21/823437; H01L 21/823475; H01L 21/823481
USPC ......................................................... 257/288
See application file for complete search history.

(56) References Cited

U.S. PATENT DOCUMENTS

| | | |
|---|---|---|
| 10,381,273 B1 | 8/2019 | Cheng et al. |
| 2017/0338233 A1 | 11/2017 | Huang et al. |
| 2020/0098681 A1* | 3/2020 | Kim ...................... H01L 23/528 |

* cited by examiner

*Primary Examiner* — Theresa T Doan
(74) *Attorney, Agent, or Firm* — Anova Law Group, PLLC

(57) ABSTRACT

Semiconductor structure and fabrication method are provided. The semiconductor structure includes a substrate, including a first region and a second region; a plurality of fins, formed on the first region of the substrate; a first isolation structure, formed on the first region between adjacent fins and on the second region of the substrate; a second isolation structure, formed in each fin and in the first isolation structure, over the first region of the substrate; and a power rail, formed in the isolation structure and partially in the substrate of the second region.

10 Claims, 8 Drawing Sheets

SEMICONDUCTOR STRUCTURE AND METHOD FOR FABRICATING THE SAME

CROSS-REFERENCE TO RELATED APPLICATION

This application is a divisional of U.S. patent application Ser. No. 17/034,335, filed on Sep. 28, 2020, which claims the priority of Chinese Patent Application No. 201911071524.9, filed on Nov. 5, 2019, the content of which is incorporated herein by reference in its entirety.

TECHNICAL FIELD

The present disclosure generally relates to the field of semiconductor manufacturing and, more particularly, relates to a semiconductor structure and a fabrication method of the semiconductor structure.

BACKGROUND

With rapid development of semiconductor manufacturing technology, semiconductor devices present a development trend of higher element density and higher level of integration. As integrated circuits (ICs) advance, the complexity of IC processing and manufacturing has increased while the semiconductor device size (e.g., minimum size of device element) is reduced.

In IC manufacturing, standard cells, used as basic elements for fabricating IC devices, are arranged and wired to form functional circuits. Each standard cell needs a power (Vdd) input and a ground (Vss) connection when in use. In order to supply power to a variety of components, each standard cell is coupled to a power rail, which is electrically connected to an active layer of the standard cell, to supply the power (Vdd). In certain cases, a plurality of power rails may be provided to each standard cell to respectively provide the power (Vdd) input and the ground (Vss) connection.

The standard cell may be designed to be a stacked structure having various metal layers, and each metal layer may include wiring traces. Various interconnection elements may be formed in the wiring traces to allow connections between various components of the standard cell and to allow connections of various components of the standard cell with other standard cells.

The standard cells may be any types of cells and may have different device architectures. For example, the standard cell may be a common multi-gate device including a fin field effect transistor (Fin FET). In a Fin FET, a fin structure may extend from a substrate and be configured to form an FET channel and source/drain regions. A gate electrode may be formed across the fin structure to provide an increased surface area for the channel, thereby forming semiconductor devices that are faster, more reliable and better controllable.

However, as the size of the semiconductor device shrinks and the device density increases, the process difficulty for fabricating the fin field effect transistor may increase, and device performance of the fabricated fin field effect transistor may be instable.

SUMMARY

One aspect of the present disclosure provides a method for fabricating a semiconductor structure. The method includes providing a substrate including a first region and a second region; forming a plurality of fins on the first region of the substrate; forming a first isolation structure on the first region and the second region of the substrate; forming a gate structure and a dummy gate structure each across the plurality of fins and the first isolation structure that are at the first region; forming an epitaxial layer in each fin on two sides of the gate structure; forming a first opening by etching a portion of each of the first isolation structure and the substrate that are at the second region; filling the first opening with a conductive material layer; removing the dummy gate structure and a portion of the conductive material layer in the first opening to form a power rail; forming a second opening by etching the plurality of fins and the first isolation structure that are at the first region, where the second opening passes through the plurality of fins along a direction perpendicular to an extending direction of the plurality of fins; and forming a second isolation structure in the second opening.

Optionally, the conductive material layer is made of a material including ruthenium, copper, graphene, or a combination thereof.

Optionally, the first opening is filled with the conductive material layer by an electrochemical deposition process.

Optionally, the second isolation structure is made of a material including silicon oxide, silicon oxynitride, silicon nitride, or a combination thereof.

Optionally, simultaneously removing the dummy gate structure and the portion of the conductive material layer.

Optionally, removing the dummy gate structure and the portion of the conductive material layer includes a dry etching process including an etching gas, including carbon tetrafluoride, boron trichloride, oxygen, chlorine, helium, or a combination thereof; an etching pressure of about 2 mTorr to about 100 mTorr; and an etching temperature of about 0° C. to about 150° C.

Optionally, etching the portion of each of the first isolation structure and the substrate that are at the second region includes etching the portion of the first isolation structure at the second region till exposing a surface of the substrate to form a first trench; and along the first trench, continuously etching the portion of the substrate to form the first opening.

Optionally, etching the portion of the first isolation structure at the second region includes forming a hard mask layer on each of the gate structure and the dummy gate structure at the first region, and on the first isolation structure at the second region; forming a first patterned photoresist layer on the hard mask layer; using the first patterned photoresist layer as a mask, etching the hard mask layer to form a third opening, where the third opening exposes the portion of the first isolation structure at the second region; and along the third opening, etching the first isolation structure at the second region till exposing the surface of the substrate to form the first trench.

Optionally, the hard mask layer includes a first hard mask layer, on each of the gate structure, the dummy gate structure and the first isolation structure, and a second hard mask layer on the first hard mask layer.

Optionally, after filling the first opening with the conductive material layer, the second hard mask layer is removed.

Optionally, removing the dummy gate structure and the portion of the conductive material layer includes forming a second patterned photoresist layer on the first hard mask layer; using the second patterned photoresist layer as a mask, etching the first hard mask layer to form a fourth opening, where the fourth opening exposes the dummy gate structure at the first region; along the fourth opening, removing the dummy gate structure; and along the third opening, removing the portion of the conductive material layer in the first opening.

Optionally, the first hard mask layer is a hybrid layer including silicon oxide and silicon nitride; and the second hard mask layer is a hybrid layer including titanium oxide and titanium nitride.

Another aspect of the present disclosure provides a semiconductor structure. The semiconductor structure includes a substrate, including a first region and a second region; a plurality of fins, formed on the first region of the substrate; a first isolation structure, formed on the first region between adjacent fins and on the second region of the substrate; a second isolation structure, formed in each fin and in the first isolation structure, over the first region of the substrate; and a power rail, formed in the isolation structure and partially in the substrate of the second region.

Optionally, the semiconductor structure further includes a metal layer on the power rail and in the isolation structure over the second region of the substrate.

Optionally, the metal layer is made of a material including cobalt, tungsten, copper, ruthenium, platinum, or a combination thereof.

Optionally, the power rail is made of a material including ruthenium, copper, graphene, or a combination thereof.

Optionally, the first isolation structure is made of a material including silicon oxide, silicon oxynitride, silicon nitride, or a combination thereof.

Optionally, the second isolation structure is made of a material including silicon oxide, silicon oxynitride, silicon nitride, or a combination thereof.

Compared with the existing technology, the technical solutions provided by the present disclosure may achieve at least the following beneficial effects.

The gate structure and the dummy gate structure may be formed first before forming the second isolation structure, the epitaxial layer may be formed between the gate structure and the dummy gate structure, and the formed epitaxial layer may have a desirable quality than the epitaxial layer formed between the gate structure and the second isolation structure, thereby improving the performance of the semiconductor structure. In addition, removing the dummy gate structure and etching the conductive material layer may be performed simultaneously, which may simplify the process flow and improve the production efficiency. Finally, the portion of the power rail is buried in the substrate to release the space occupied by the wiring traces in the metal layers of the standard cell; when a same response speed of the semiconductor structure is satisfied, the size of the standard cell may be reduced, which is beneficial for the advancement to the next process node of the semiconductor technology; or under a same size of the standard cell, more space may be available for the wiring traces, thereby improving the performance of the semiconductor structure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
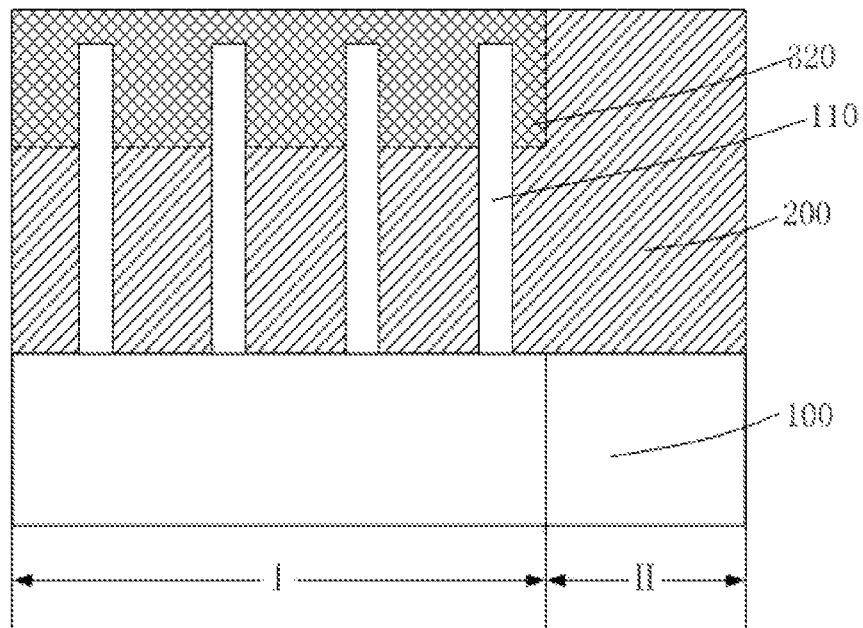
FIGS. 1-13 illustrate structural schematics corresponding to certain stages of a method for forming an exemplary semiconductor structure according to various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

A semiconductor structure and its fabrication method are provided in the present disclosure. The method includes providing a substrate including a first region and a second region; forming a plurality of fins on the first region of the substrate; forming a first isolation structure on the first region and the second region of the substrate; forming a gate structure and a dummy gate structure each across fins and the first isolation structure at the first region; forming an epitaxial layer in each fin on two sides of the gate structure; forming a first opening by etching a portion of each of the first isolation structure and the substrate that are at the second region; filling the first opening with a conductive material layer; removing the dummy gate structure and a portion of the conductive material layer in the first opening to form a power rail; and forming a second isolation structure in a second opening.

When a power rail is used to supply power to the standard cell in the integrated circuit, the power rail is arranged in one or more of the metal layers of the standard cell. A conduction path is then used to connect the metal layer and the power rail that is connected between metal layers or used to connect the power rail to the active layer of the standard cell. The metal layer includes wiring traces; and the more wiring traces are, the faster the response speed of the semiconductor structure is. The arrangement of the power rail in the metal layer may cause the reduction of the space available for wiring traces, resulting in a decrease in the semiconductor speed and affecting the device performance of the semiconductor structure. Therefore, there is a need to fabricate a semiconductor structure with a buried power rail, where a portion of the power rail may be buried in the substrate and located at a same layer as the active layer of the standard cell.

Furthermore, as the size of the semiconductor device continues to shrink, the distance between adjacent fins may decrease, the process difficulty for fabricating the fin field effect transistor may increase, and the process flow may be complexed. In addition, the bridging problem between adjacent devices may be more likely to occur, which may result in the performance degradation of the fabricated semiconductor structure. Therefore, a single diffusion break (SDB) isolation structure has introduced in the existing technology. When forming the semiconductor structure, the SDB isolation structure may be formed first and the gate structure may then be formed, and finally an epitaxial layer may be formed in the fin on two sides of the gate structure. However, the quality of the epitaxial layer formed between the gate material and the oxide material commonly used for forming the SDB isolation structure may not be desirable, which is not beneficial for the performance of the semiconductor structure.

Various embodiments of the present disclosure provide a semiconductor structure and its fabrication method. For example, a gate structure and a dummy gate structure may be formed first, then an epitaxial layer may be formed in the fin on two sides of the gate structure, and finally the dummy gate structure may be removed to form a second isolation structure, which may ensure the quality of the formed epitaxial layer; in addition, the removal of the dummy gate structure and the formation of the power rail may be simultaneous achieved by etching, which may simplify the process flow of the semiconductor structure, improve the production efficiency and save costs; and a portion of the power rail is buried in the substrate to release the space occupied by the wiring traces, which may improve the response speed of the semiconductor structure, reduce the size of the standard cell, and improve the performance of the semiconductor structure.

In order to clearly illustrate the above-mentioned described objectives, features, and advantages of the present disclosure, various embodiments of the present disclosure are described in detail with reference to the accompanying drawings hereinafter.

FIGS. 1-13 illustrate structural schematics corresponding to certain stages of a method for forming an exemplary semiconductor structure according to various disclosed embodiments of the present disclosure.

Figure 14:
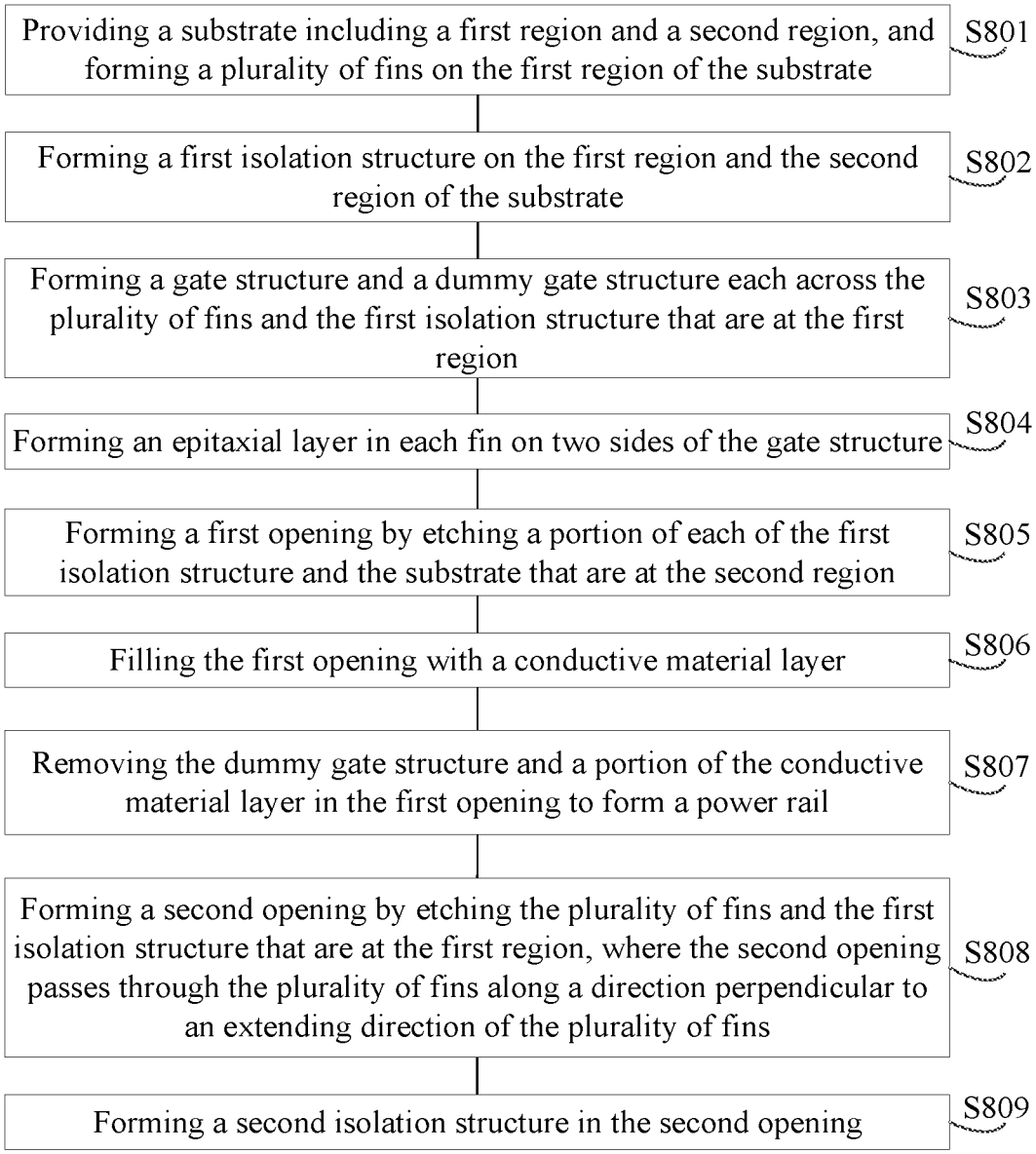
FIG. 14 illustrates a flowchart of an exemplary fabrication method for forming a semiconductor structure according to various disclosed embodiments of the present disclosure.

Referring to FIG. 1, a substrate 100, including a first region I and a second region II adjacent to each other, may be provided; and a plurality of fins 110 may be formed on the first region I of the substrate 100 (e.g., in S801 of FIG. 14).

In one embodiment, the substrate 100 may be a silicon substrate. In other embodiments, the substrate 100 may also be any one of a germanium substrate, a silicon germanium substrate or a silicon carbide substrate, a silicon-on-insulator or a germanium-on-insulator substrate, and/or any other suitable substrate(s).

In one embodiment, the fin 110 may be made of silicon. In other embodiments, the fin 110 may also be made of a material including germanium, silicon germanium, and/or any other suitable material(s).

In one embodiment, forming the fin 110 on the first region I of the substrate 100 may include forming a patterned layer (not shown) on the substrate 100, where the patterned layer corresponds to the position where the fin 110 needs to be formed on the first region I of the substrate 100; using the patterned layer as a mask, etching a portion of the substrate 100 at the first region I to form a plurality of discrete fins 110; and removing the patterned layer.

The spacings between the adjacent formed fins 110 may be equal or not equal to each other.

Referring to FIG. 1, a first isolation structure 200 may be formed on the first region I and the second region II of the substrate 100 (e.g., in S802 of FIG. 14).

In one embodiment, the isolation structure 200 may be made of silicon dioxide. In other embodiments, the isolation structure 200 may also be made of silicon oxynitride, silicon nitride, and/or any other suitable material(s).

In one embodiment, the top surface of the first isolation structure 200 may be higher than the top surface of the fin 110.

In one embodiment, the first isolation structure 200 may be used to isolate the adjacent fins 110 to prevent subsequent leakage, short circuit, and other phenomena.

In one embodiment, forming the first isolation structure 200 may include depositing a first isolation material layer on the first region I and the second region II of the substrate 100, where the first isolation material layer may cover the surface of the substrate 100, the sidewalls and the top surfaces of the fins 110 at the first region I; and performing a chemical mechanical planarization process on the first isolation material layer to form the first isolation structure 200.

In one embodiment, the first isolation material layer may be deposited using a fluid chemical vapor deposition process, such that the filling performance of the first isolation material layer may be desirable.

Figure 2:
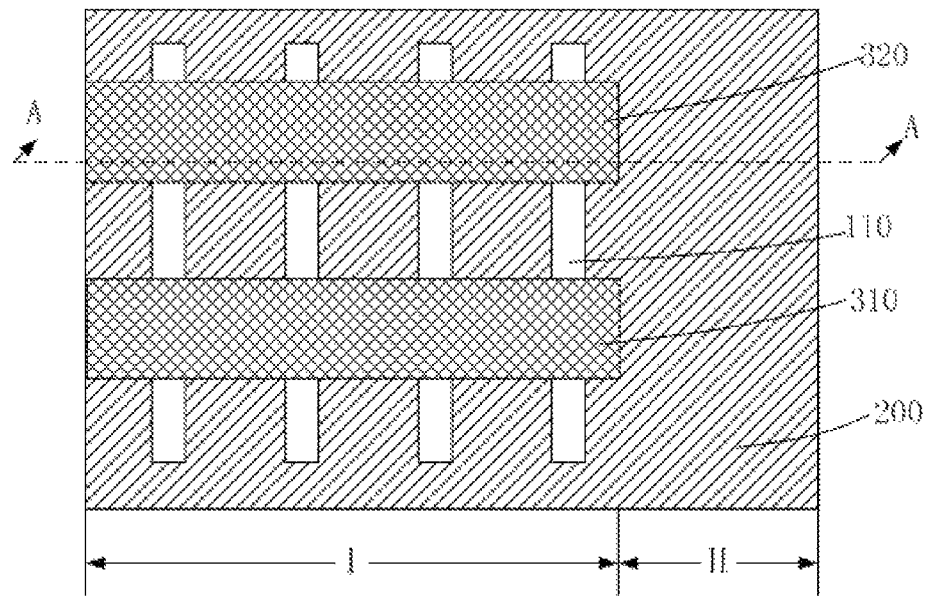

FIG. 2 illustrates a top view of the semiconductor structure in FIG. 1; and FIG. 1 illustrates a cross-sectional structural schematic of the semiconductor structure along an AA direction in FIG. 2.

Referring to FIGS. 1-2, after forming the first isolation structure 200, a gate structure 310 and a dummy gate structure 320 each across the fins 110 and the first isolation structure 200 at the first region I may be formed (e.g., in S803 of FIG. 14).

In one embodiment, the gate structure 310 and the dummy gate structure 320 may be adjacent to each other.

In one embodiment, before forming the gate structure 310 and the dummy gate structure 320, the first isolation structure 200 at the first region I may be first etched to expose the top and a portion of the sidewalls of the fins 110.

After the gate structure 310 and the dummy gate structure 320 are formed, an epitaxial layer (not shown) may be formed in each fin 110 on two sides of the gate structure 310 (e.g., in S804 of FIG. 14).

In one embodiment, the epitaxial layer may be formed by an epitaxial growth process. The epitaxial layer may be made of a material including silicon, germanium, silicon germanium, and/or any suitable material(s).

In one embodiment, the epitaxial layer may be used to form a source region and a drain region.

In one embodiment, forming the epitaxial layer may include etching the fin 110 on two sides of the gate structure 310 to form an opening in the fin 110 on two sides of the gate structure 310; and forming the epitaxial layer in the opening through an epitaxial growth process.

In one embodiment, the gate structure 310 and the dummy gate structure 320 may be formed first, and then the epitaxial layer may be formed in the fin 110 on two sides of the gate structure 310. In such way, the quality of the epitaxial layer formed may be desirable, which is beneficial for improving the performance of the semiconductor structure.

After forming the epitaxial layer, a portion of each of the first isolation structure 200 and the substrate 100 at the second region II may be etched to form a first opening.

In one embodiment, the first isolation structure 200 and the substrate 100 at the second region II may be etched stepwise. A portion of the first isolation structure 200 at the second region II may be etched first till exposing the surface of the substrate 100, and then a portion of the substrate 100 may be etched.

For example, etching the portion of the first isolation structure 200 at the second region II may be described hereinafter.

FIGS. 3-10 illustrate cross-sectional structural schematics of the semiconductor structure along the AA direction in FIG. 2.

Figure 3:
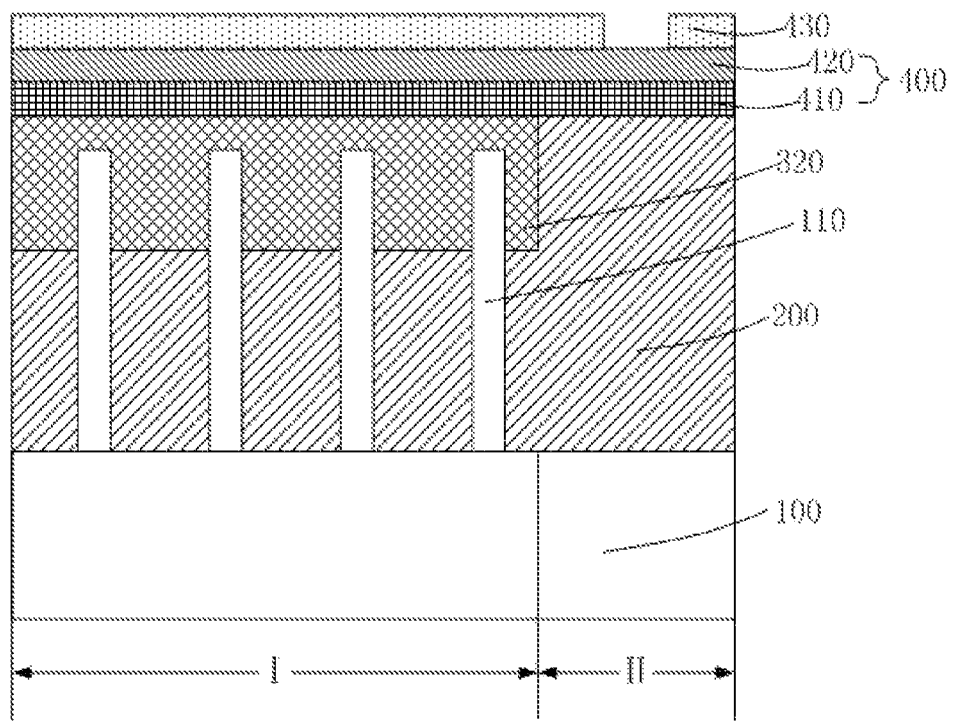

Referring to FIG. 3, a hard mask layer 400 may formed on the surfaces of the gate structure 310 and the dummy gate structure 320 at the first region I, and the surface of the first isolation structure 200 at the second region II.

In one embodiment, the hard mask layer 400 may include a first hard mask layer 410 on the surfaces of the gate structure 310, the dummy gate structure 320, and the first isolation structure 200, and include a second hard mask layer 420 on the surface of the first hard mask layer 410.

In one embodiment, the material of the first hard mask layer 410 may be a hybrid layer of silicon oxide and silicon nitride. In other embodiments, the first hard mask layer 410 may also be a hybrid layer of silicon oxide and silicon carbide.

In one embodiment, the material of the second hard mask layer 420 may be a hybrid layer of titanium oxide and titanium nitride. In other embodiments, the second hard mask layer 420 may also be a hybrid layer of oxide and aluminum nitride or oxide and boron nitride.

In one embodiment, forming the hard mask layer 400 may include forming the first hard mask layer 410 on the surface of the gate structure 310 and the surface of the dummy gate structure 320 at the first region I, and the surface of the first isolation structure 200 at the second region; and then forming the second hard mask layer 420 on the first hard mask layer 410.

The first hard mask layer 410 may be formed by a process including a chemical vapor deposition process, a physical vapor deposition process, an atomic layer deposition process, or a combination thereof. The second hard mask layer 420 may be formed by a process including a chemical vapor deposition process, a physical vapor deposition process, an atomic layer deposition process, or a combination thereof.

Referring to FIG. 3, a first patterned photoresist layer 430 may be formed on the hard mask layer 400.

In one embodiment, forming the first patterned photoresist layer 430 may include depositing a first photoresist material on the surfaces of the gate structure 310, the dummy gate structure 320, and the first isolation structure 200; and developing and exposing the first photoresist material to form the first patterned photoresist layer 430. The first patterned photoresist layer 430 may expose a portion of the hard mask layer 400 on the surface of the first isolation structure 200 at the second region II.

Figure 4:
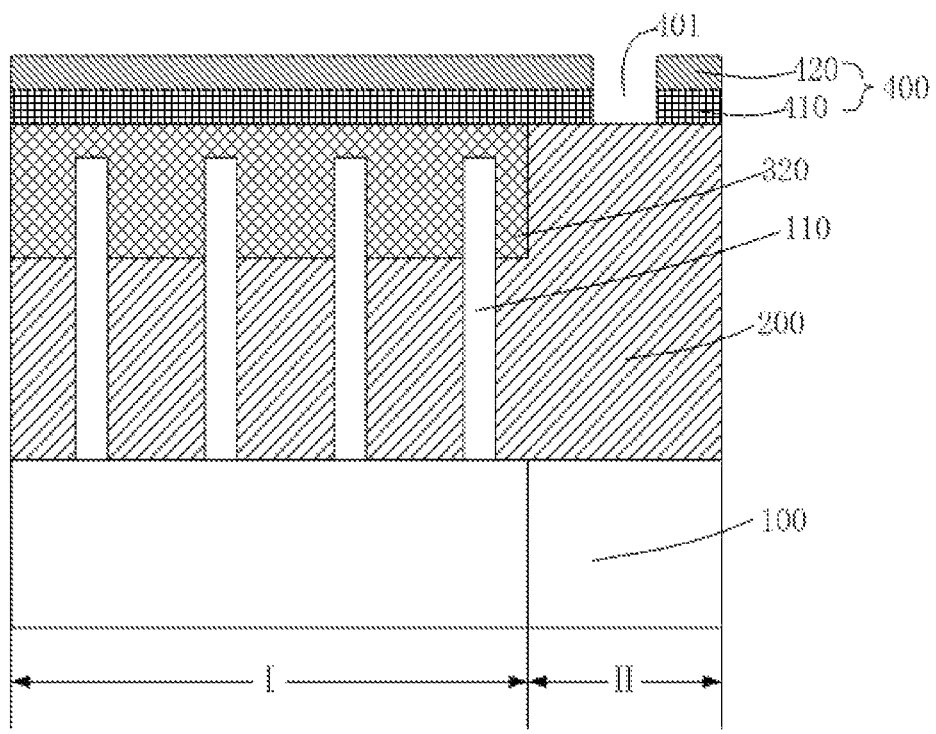

Referring to FIG. 4, using the first patterned photoresist layer 430 as a mask, the hard mask layer 400 may be etched to form a third opening 401. The third opening 401 may expose a portion of the first isolation structure 200 at the second region II.

In one embodiment, etching the hard mask layer 400 may include first etching the second hard mask layer 420 till exposing the surface of the first hard mask layer 410, and then etching the first hard mask layer 410 till exposing the surface of the first isolation structure 200.

In one embodiment, the second hard mask layer 420 may be etched by a dry etching process. The etching gas of the dry etching process may include trifluoromethane ($CHF_3$), carbon tetrafluoride ($CF_4$), fluoromethane ($CH_3F$), oxygen, or a combination thereof.

In one embodiment, the first hard mask layer 410 may be etched by a dry etching process. The etching gas of the dry etching process may include chlorine, oxygen, methane ($CH_4$), or a combination thereof.

After the third opening 401 is formed, the first patterned photoresist layer 430 may be removed by a wet etching process or an ashing process.

Figure 5:
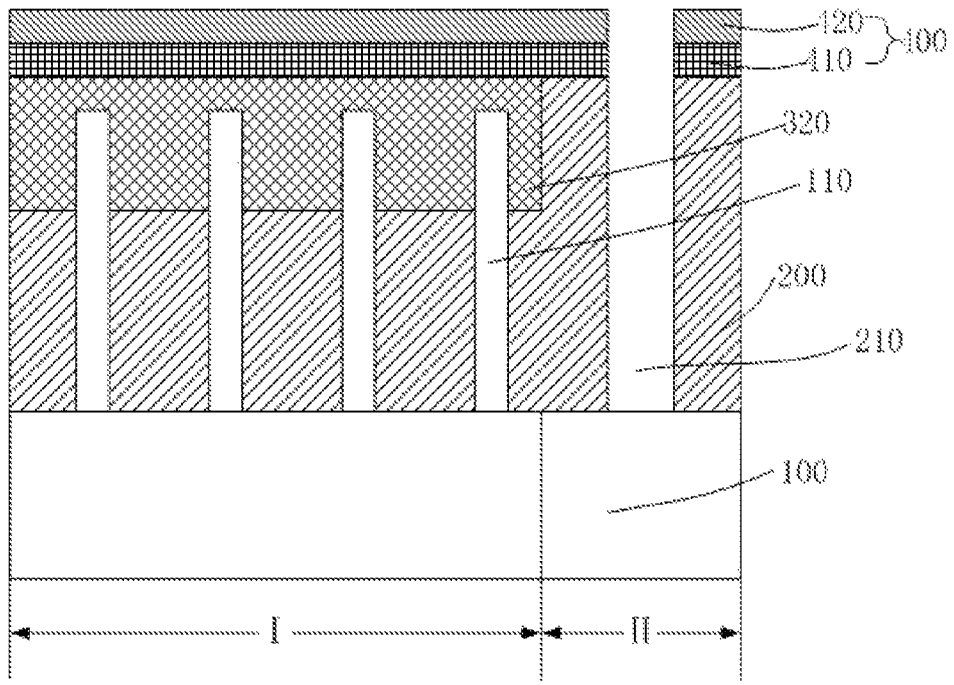

Referring to FIG. 5, the exposed first isolation structure 200 at the second region II may be etched along the third opening 401 till exposing the surface of the substrate 100 to form a first trench 210.

In one embodiment, the first isolation structure 200 may be etched by a plasma dry etching process. The process parameters of the plasma dry etching process may include the etching gas, including trifluoromethane ($CHF_3$), carbon tetrafluoride ($CF_4$), fluoromethane ($CH_3F$), oxygen, or a combination thereof, the etching pressure of about 5 mTorr to about 100 mTorr, and the etching temperature of about 10° C. to about 120° C.

Figure 6:
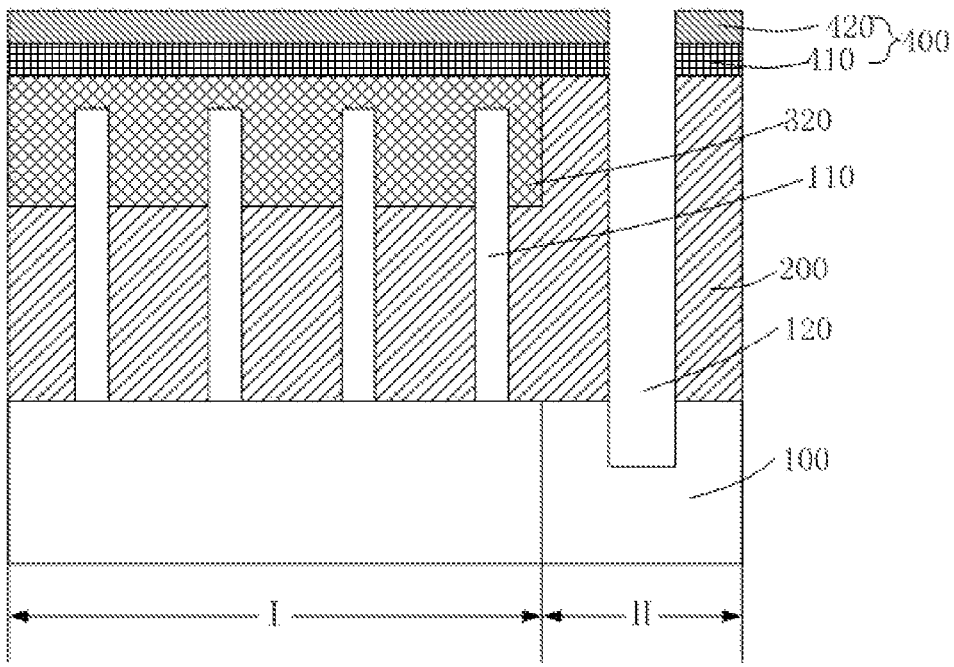

Referring to FIG. 6, a portion of the substrate 100 may be etched along the first trench 210 to form a first opening 120 (e.g., in S805 of FIG. 14).

In one embodiment, the thickness of the etched substrate 100 may be about 300 Å to about 1000 Å. The thickness to-be-etched of the substrate 100 may be selected according to actual process requirements.

In one embodiment, the substrate 100 may be etched by a plasma dry etching process. The process parameters of the plasma dry etching process may include the etching gas, including hydrogen bromide (HBr), trifluoride Nitrogen ($NF_3$), chlorine, oxygen, or any combination thereof, the etching pressure of about 5 mTorr to about 100 mTorr, and the etching temperature of about 10° C. to about 120° C.

Figure 7:
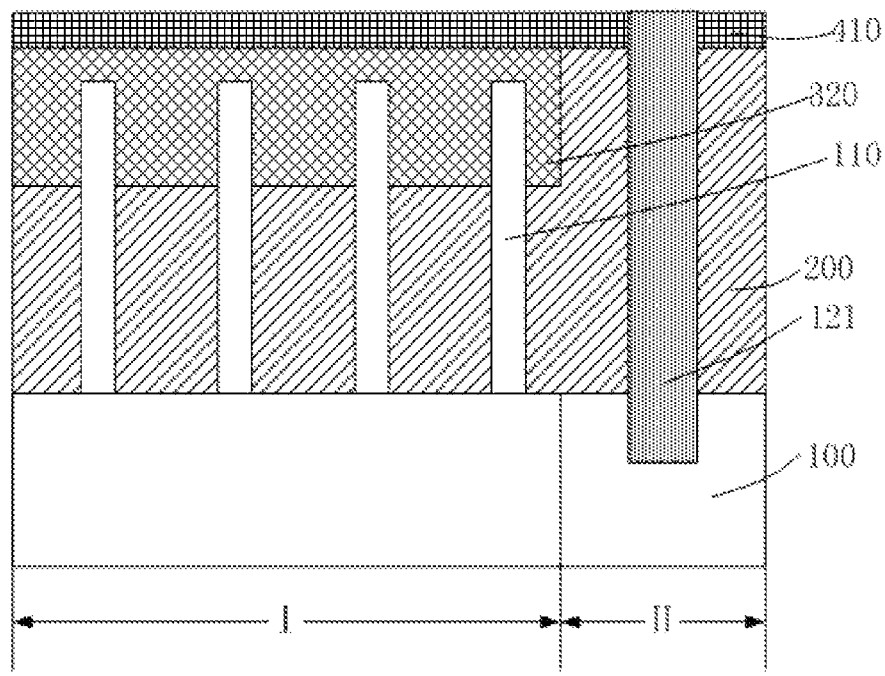

Referring to FIG. 7, after the first opening 120 is formed, a conductive material layer 121 may be filled in the first opening 120 (e.g., in S806 of FIG. 14).

In one embodiment, after the conductive material layer 121 is formed, a chemical mechanical polishing process may be further performed on the conductive material layer 121.

In one embodiment, the conductive material layer 121 may be made of ruthenium (Ru). In other embodiments, the conductive material layer 121 may also be made of copper (Cu), graphene, and/or any other suitable material(s).

In one embodiment, ruthenium may be used as the material for forming the power rail. Ruthenium has desirable electrical conductivity, high temperature and corrosion resistance, and excellent electrical performance. It may be an excellent choice for replacing original conductive materials such as copper in the next semiconductor technological process.

In one embodiment, filling the conductive material layer 121 may be performed by an electrochemical deposition process.

It should be noted that, in one embodiment, when the chemical mechanical polishing process is performed on the conductive material layer 121, the second hard mask layer 420 may also be removed by polishing. The first hard mask layer 410 may serve as a polishing stop layer for the chemical mechanical polishing process, and may also serve as a protective layer for the first isolation structure 200 and the dummy gate structure 320 to prevent the first isolation structure 200 and the dummy gate structure 320 from being damaged during the chemical mechanical polishing process.

Figure 8:
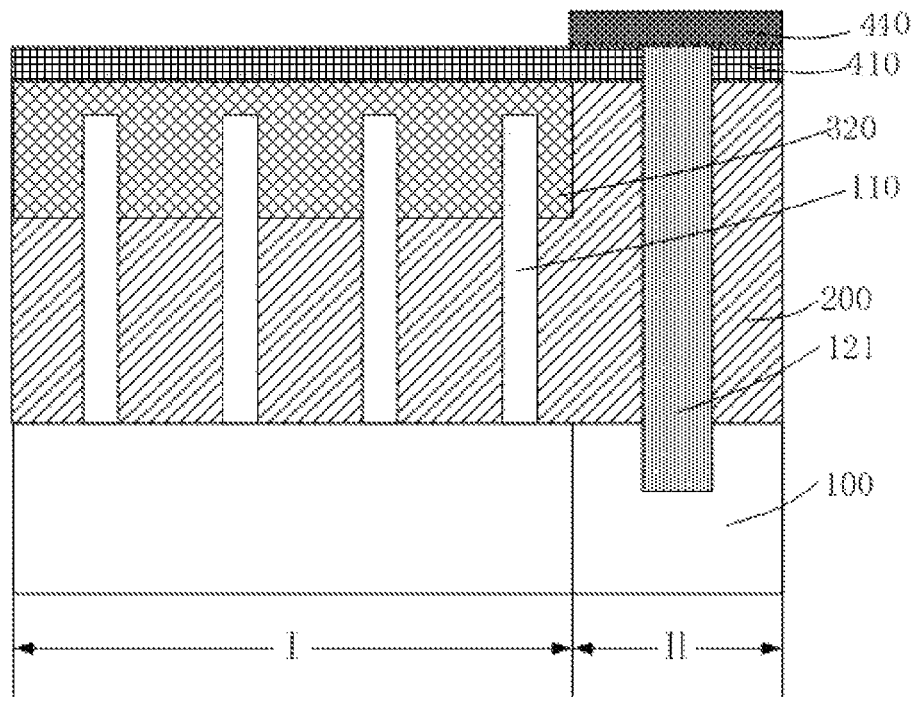

Referring to FIG. 8, a second patterned photoresist layer 440 may be formed on the first hard mask layer 410.

In one embodiment, the second patterned photoresist layer 440 may expose the first hard mask layer 410 on the surface of the dummy gate structure 320 at the first region I.

Figure 9:
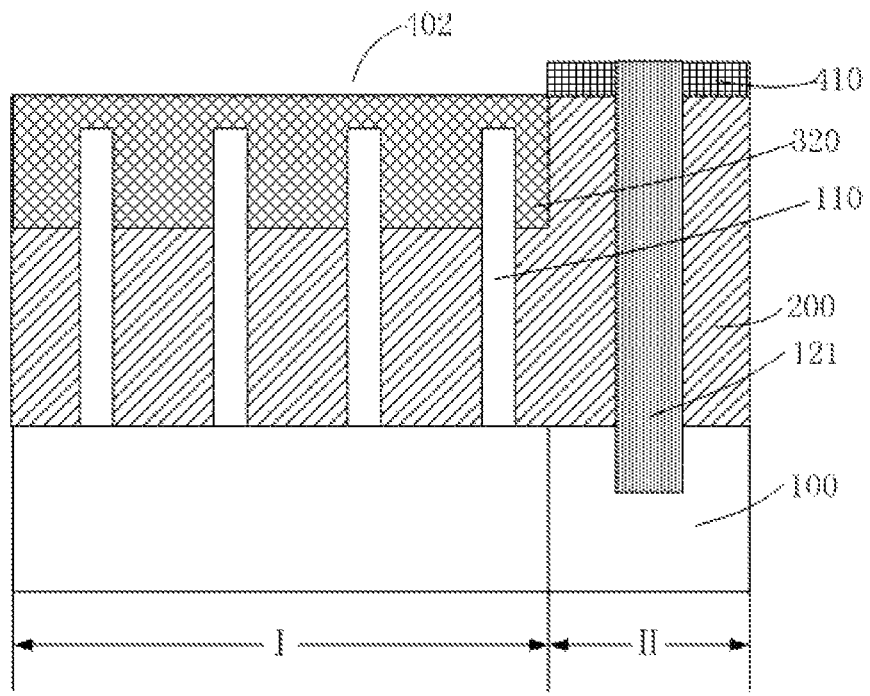

Referring to FIG. 9, using the second patterned photoresist layer 440 as a mask, the first hard mask layer 410 may be etched to form a fourth opening 402. The fourth opening 402 may expose the dummy gate structure 320 at the first region I.

After the fourth opening 402 is formed, the second patterned photoresist layer 440 may be removed by a wet etching process or an ashing process.

Figure 10:
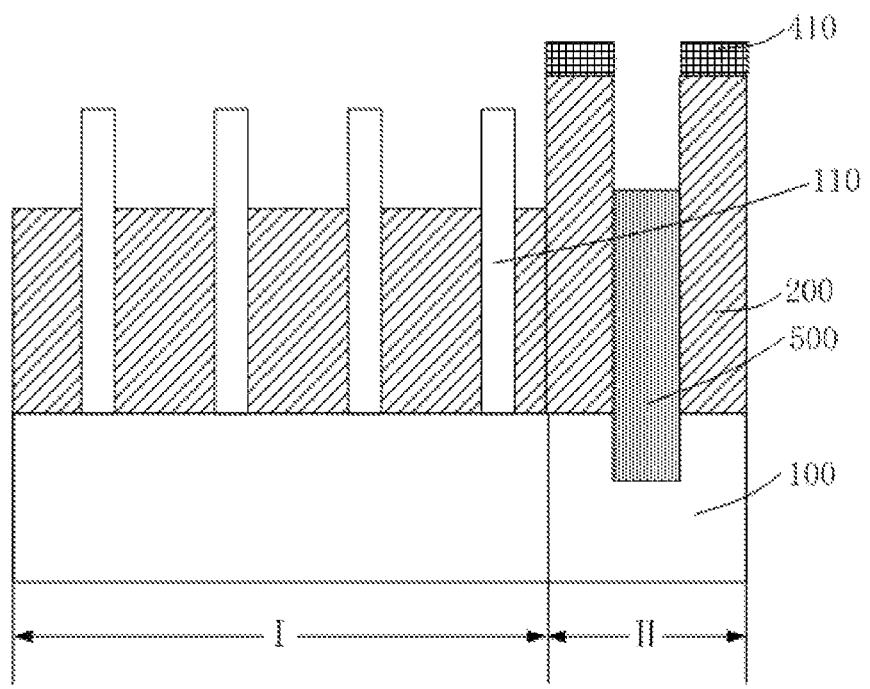

Referring to FIG. 10, the dummy gate structure 320 may be removed by etching along the fourth opening 402 till exposing the surface of the first isolation structure 200; meanwhile, a portion of the conductive material layer 121 in the first opening 120 may be removed by etching along the third opening 401 to form a power rail 500 (e.g., in S807 of FIG. 14).

In one embodiment, the dummy gate structure 320 and the conductive material layer 121 may be simultaneously etched using a dry etching process. An additional mask is not needed to be added in the dry etching process, which may simplify the process.

In one embodiment, the process parameters of the dry etching process may include the etching gas, including carbon tetrafluoride ($CF_4$), boron trichloride ($BCl_3$), oxygen, chlorine, helium, or a combination thereof, where the flow rate of carbon tetrafluoride is about 0 sccm to 100 sccm, the flow rate of boron trichloride is about 30 sccm to about 500 sccm, the flow rate of oxygen is about 0 sccm to about 100 sccm, the flow rate of chlorine is about 0 sccm to about 100 sccm, and the flow rate of helium is about 50 sccm to about 500 sccm, and further include the etching pressure of about 2 mTorr to about 100 mTorr, and the etching temperature of about 0° C. to about 150° C.

Figure 11:
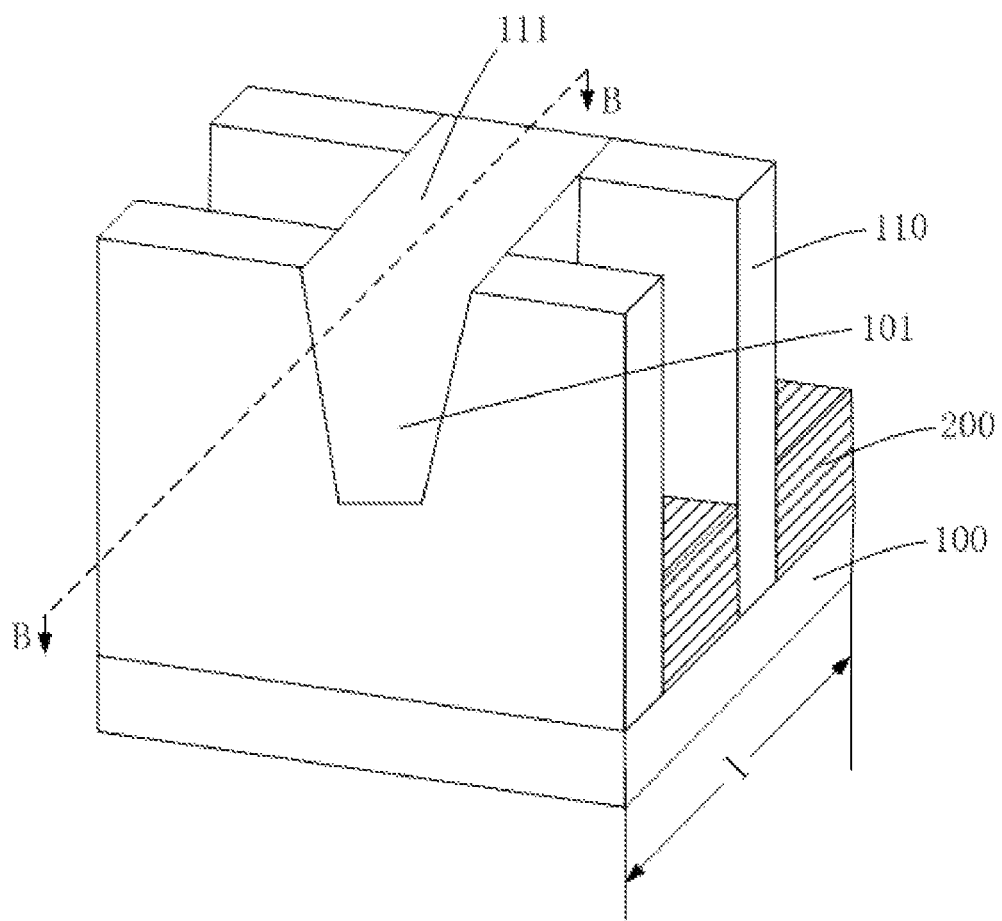
Figure 12:
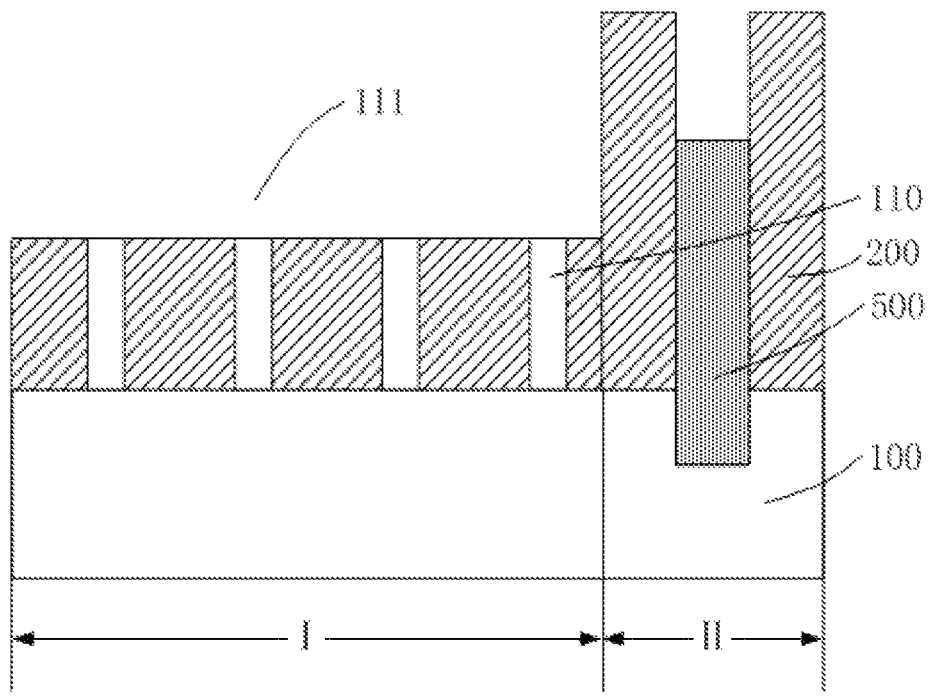

FIG. 11 illustrates a stereoscopic structural schematic of the fins 110 on the first region I of the substrate 100, and FIG. 12 illustrates a cross-sectional view of the semiconductor structure along the BB direction in FIG. 11.

Referring to FIGS. 11-12, after the dummy gate structure 320 is removed, the fins 110 and the first isolation structure 200 at the first region I may be etched to form a second opening 111; and the second opening 111 may pass through the fins 110 along a direction perpendicular to the extending direction of the fins 110 (e.g., in S808 of FIG. 14).

In one embodiment, the position for etching the fins 110 may correspond to the previous position of the dummy gate structure 320, that is, a subsequent second isolation structure may be formed at the position of the dummy gate structure 320.

In one embodiment, the fins 110 may be etched first to form a first trench 101 formed in the fins 110. The first trench 101 may pass through the fins 110 along the direction perpendicular to the extending direction of the fins 110.

In one embodiment, the fins 110 may be etched by a dry etching process.

After the first trench 101 is formed, the first isolation structure 200 at the first region may be etched to form a second trench (not shown). The bottom of the second trench may be coplanar with the bottom of the first trench 101. The first trench 101, the second trench, and the space between adjacent fins 110 may jointly form the second opening 111. The second opening 111 may pass through the fins 110 along the direction perpendicular to the extending direction of the fins 110.

Figure 13:
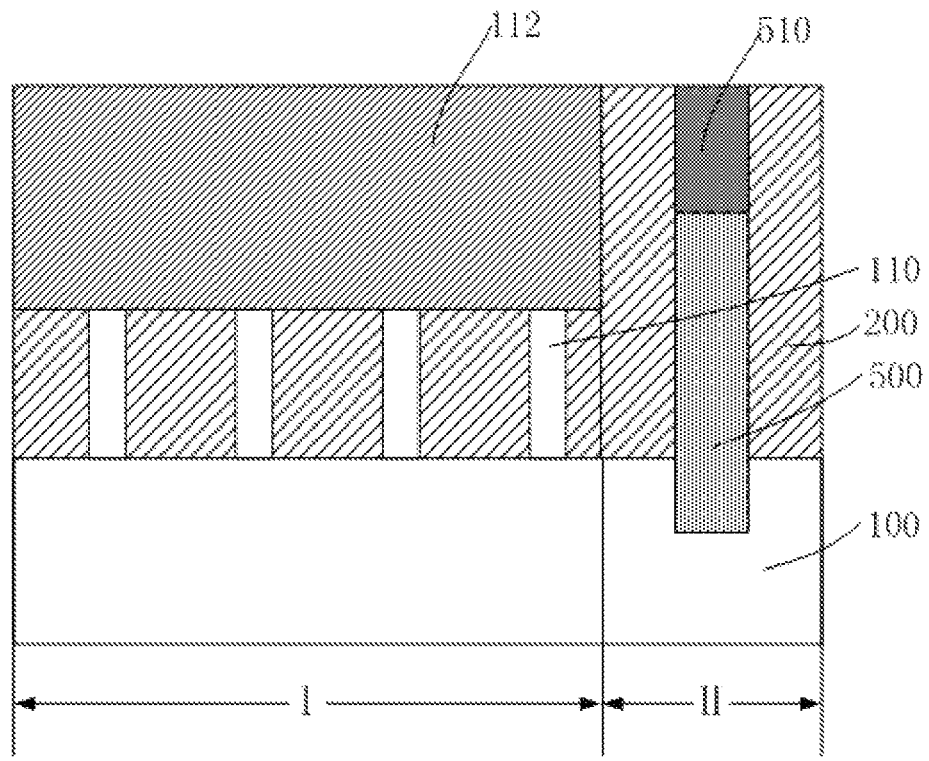

Referring to FIG. 13, a second isolation structure 112 may be formed in the second opening 111 (e.g., in S809 of FIG. 14).

In one embodiment, the second isolation structure 112 may be used to isolate adjacent sources and drains in the fins 110.

In one embodiment, the second isolation structure 112 may be formed by a fluid chemical vapor deposition process. The second isolation structure 112 formed by the fluid chemical vapor deposition process may have a relatively strong filling capacity for the second opening, such that the formed second isolation structure 112 may have desirable isolation performance.

In one embodiment, the second isolation structure 112 may be made of silicon dioxide. In other embodiments, the second isolation structure may also be made of silicon oxynitride, silicon nitride, and/or any other suitable material(s).

Referring to FIG. 13, a metal layer 510 may be further formed on the power rail 500.

The metal layer 510 may be made of a metal material including cobalt, tungsten, copper, ruthenium, platinum, and/or any other suitable material(s).

Forming the metal layer 510 may include forming a dielectric layer on the power rail 500 while forming the second isolation structure 112 in the second opening 111, where the material of the dielectric layer may be same as the material of the second isolation structure 112; etching the dielectric layer to expose the power rail 500; and forming the metal layer 510 on the power rail 500.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A semiconductor structure, comprising:
   a substrate, including a first region and a second region;
   a plurality of fins, formed on the first region of the substrate;
   a first isolation structure, formed on the first region between adjacent fins and on the second region of the substrate;
   a second isolation structure, formed in each fin and in the first isolation structure, over the first region of the substrate; and
   a power rail, formed in the isolation structure and partially in the substrate of the second region, a top surface of the power rail being higher than a top surface of the plurality of fins.

2. The semiconductor structure according to claim 1, further including:
   a metal layer on the power rail and in the isolation structure over the second region of the substrate.

3. The semiconductor structure according to claim 2, wherein:
   the metal layer is made of a material including cobalt, tungsten, copper, ruthenium, platinum, or a combination thereof.

4. The semiconductor structure according to claim 1, wherein:
   the power rail is made of a material including ruthenium, copper, graphene, or a combination thereof.

5. The semiconductor structure according to claim 1, wherein:
   the first isolation structure is made of a material including silicon oxide, silicon oxynitride, silicon nitride, or a combination thereof.

6. The semiconductor structure according to claim 1, wherein:
   the second isolation structure is made of a material including silicon oxide, silicon oxynitride, silicon nitride, or a combination thereof.

7. The semiconductor structure according to claim 1, wherein:
   a bottom surface of the power rail is lower than a top surface of the substrate.

8. The semiconductor structure according to claim 1, further including:
   an epitaxial layer in each fin on two sides of a gate structure.

9. The semiconductor structure according to claim 8, wherein:
   the epitaxial layer is made of a material including silicon, germanium, or silicon germanium.

10. The semiconductor structure according to claim 2, wherein:
- a top surface of the metal layer is coplanar with a top surface of the second isolation structure of the first region; and
- the top surface of the metal layer is coplanar with a top surface of the first isolation structure of the second region.

* * * * *